United States Patent
Endo et al.

(10) Patent No.: US 6,432,849 B1
(45) Date of Patent: Aug. 13, 2002

(54) SUBSTRATE STORAGE CASSETTE POSITIONING DEVICE AND METHOD

(75) Inventors: Yutaka Endo, Fukaya; Nobuyoshi Tanno, Zao-machi, both of (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/629,166

(22) Filed: Jul. 31, 2000

Related U.S. Application Data (63) Continuation of application No. PCT/JP99/00444, filed on Feb. 3, 1999.

(30) Foreign Application Priority Data

Feb. 4, 1998 (JP) .......................................... 10-023565

(51) Int. Cl.⁷ ......................... H01L 21/00; B65G 49/07; B65D 85/00
(52) U.S. Cl. ............... 438/800; 206/710; 414/DIG. 940
(58) Field of Search ...................... 438/800; 206/710, 206/711; 414/DIG. 940, DIG. 935, DIG. 938

(56) References Cited

U.S. PATENT DOCUMENTS

| | | | |
|---|---|---|---|
| 5,473,410 A | * 12/1995 | Nishi | 355/53 |
| 5,642,713 A | * 7/1997 | Schmitz et al. | 123/435 |
| 5,711,427 A | * 1/1998 | Nyseth | 206/710 |

FOREIGN PATENT DOCUMENTS

| JP | 60-117745 A | * 6/1985 |
| JP | 60-117745 | * 6/1985 |
| JP | 3-45645 | * 4/1991 |
| JP | 6-340304 | * 12/1994 |
| JP | 7-297269 | * 11/1995 |
| JP | 8-37224 | * 2/1996 |
| JP | 8-37224 A | * 2/1996 |
| JP | 9-107019 | * 4/1997 |
| JP | 9-148423 | * 6/1997 |
| JP | 9-246348 | * 9/1997 |
| JP | 10-23565 | * 1/1998 |

* cited by examiner

*Primary Examiner*—Michael Sherry
*Assistant Examiner*—Evan Pert
(74) *Attorney, Agent, or Firm*—Oliff & Berridge, PLC (57) ABSTRACT

A substrate storage cassette positioning device and method for positioning a substrate storage cassette in a predetermined location on an installation platform, comprising a guide section for guiding the substrate storage cassette into a predetermined location during the positioning of the substrate storage cassette.

16 Claims, 8 Drawing Sheets

SUBSTRATE STORAGE CASSETTE POSITIONING DEVICE AND METHOD

This is a Continuation of; International Application No. PCT/JP99/00444 filed Feb. 3, 1999 which designated the U.S.

TECHNICAL FIELD

The present invention relates to an exposure apparatus used in a semiconductor manufacturing process for example, and to a substrate storage cassette positioning device for storing a substrate to be exposed with the exposure apparatus, and in particular relates to an exposure apparatus, a substrate storage cassette positioning device, and a method of transporting a substrate storage cassette, in which a substrate is transported in and out with a loader system relative to a substrate storage cassette positioned on an installation platform.

BACKGROUND ART

In exposure apparatus used in the photolithography process of the manufacture of a semiconductor device, in order to ensure efficient exposure of a photo mask or a reticle pattern on to a single lot wafer stored on a wafer cassette, a wafer loader system is generally provided for transporting the wafer in and out with respect to the wafer cassette.

Moreover, a reticle loader system for selecting a plurality of reticles and setting the reticle on the exposure apparatus is also provided with the exposure apparatus.

This type of loader system extracts a wafer with a robot arm or the like from a wafer cassette holding a plurality of wafers, and transports the wafer to a wafer stage, and also returns the wafer from the wafer stage back to the wafer cassette.

In order to ensure that the robot is able to accurately extract the wafer, the wafer cassette is positioned by installation at a predetermined location on an installation platform, which is aligned relative to the robot.

However in recent years, accompanying the development of large diameter wafers (of diameters of 300 mm, for example), a variety of wafer cassettes corresponding to these larger wafers have been developed and proposed.

One method of positioning this type of wafer cassette onto an installation platform comprises using kinematic coupling to ensure that the positioning on to the installation platform is carried out with a high level of precision, even if the transfer precision during installation on to the installation platform is rough, and this method is now employed as a standard practice amongst companies associated with semiconductor manufacture.

Figure 10:
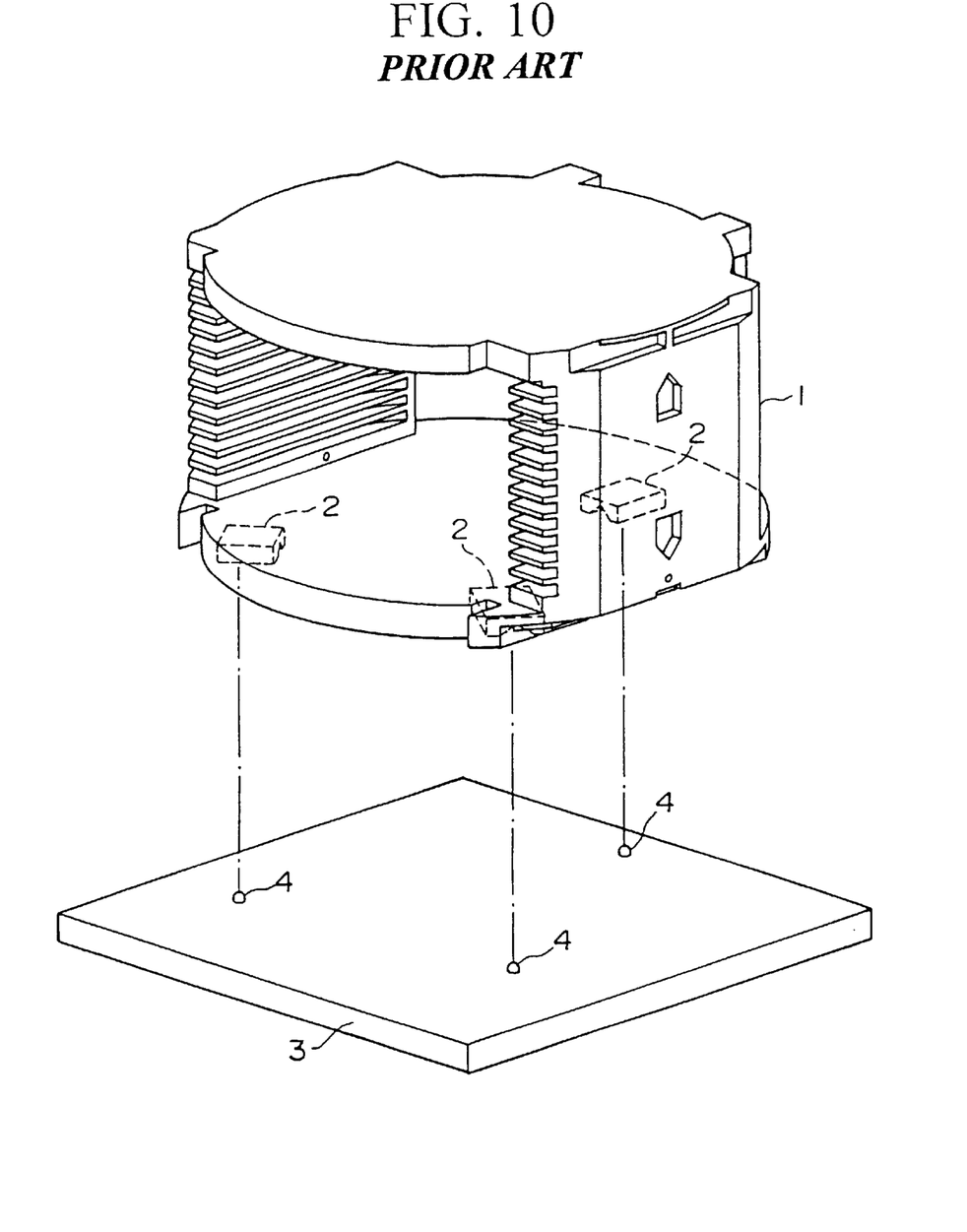
FIG. 10 is an external perspective view showing the use of conventional technology for positioning a wafer cassette into a predetermined location on an installation platform.

FIG. 10 shows an example of an installation platform and a wafer cassette positioned by kinematic coupling.

As is shown in the diagram, three slot members 2 each comprising a V shaped slot which widens out in a downward direction are provided at an interval of 120° in a radial arrangement on the bottom surface of a wafer cassette 1.

Kinematic coupling pins 4 which engage with the V shaped slots of the slot members 2 are then provided on an installation platform 3, in positions corresponding to, and facing, the V shaped slots.

By installing the wafer cassette 1 down onto the installation platform 3, so that the V shaped slots and the kinematic coupling pins 4 engage, the wafer cassette 1 can be positioned at a predetermined location on the installation platform 3.

However, the following problems exist with the conventional type of exposure apparatus described above.

When an operator installs the wafer cassette 1 onto the installation platform 3, because the slot members 2 and the kinematic coupling pins 4 are obscured by the wafer cassette 1 when viewed from above, it has been necessary to confirm the positional relationship of the slot members 2 and the kinematic coupling pins 4 from side on, which takes considerable time.

Furthermore, although there is a limit on the positioning deviation permissible for positioning the V shaped slots onto the kinematic coupling pins 4, it is still possible to install the wafer cassette 1 onto the installation platform 3, even if this limit is exceeded.

In such a case, because the wafer cassette 1 ends up being positioned on the installation platform 3 in a location different from the predetermined location, the robot arm may interfere with the wafer when attempting to retrieve the wafer, resulting in damage to the arm and/or the wafer, or even to the body of the robot itself.

The present invention takes the above factors into consideration, with an object of providing an exposure apparatus, a substrate storage cassette positioning device, and a method of transporting a substrate storage cassette, which enable a reduction in the operational time associated with installing a wafer cassette, and wherein by ensuring the positioning of the wafer cassette in a predetermined location, damage to each of the sections can be avoided, and reliability can be improved.

DISCLOSURE OF THE INVENTION

In order to achieve the above object, the present invention employs a construction in accordance with the embodiments shown in FIG. 1 through FIG. 6.

A substrate storage cassette positioning device according to a first aspect of the present invention is a substrate storage cassette positioning device for positioning a substrate storage cassette (43) in a predetermined location on an installation platform (40, 41), comprising a guide section (59) for guiding the substrate storage cassette (43) into a predetermined location during the positioning of the substrate storage cassette (43).

Consequently, in a substrate storage cassette positioning device of the present invention, when the substrate storage cassette (43) is installed onto an installation platform (40, 41), the substrate storage cassette (43) is guided into a predetermined location by the guide section (59).

A substrate storage cassette positioning device according to a second aspect of the present invention is a substrate storage cassette positioning device according to the first aspect of the present invention, wherein positioning concave portions (52) are provided on the bottom surface (51) of the substrate storage cassette (43), and convex portions (57) which will freely engage with the concave portions (52) of the substrate storage cassette (43) are provided on the top of the installation platform (40, 41).

Consequently, in a substrate storage cassette positioning device of the present invention, the substrate storage cassette (43) is positioned in a predetermined location on an installation platform (40, 41) by engaging the concave portions (52) provided on the bottom surface (51) of the substrate storage cassette (43) with the convex portions (57) provided on the top of the installation platform (40, 41).

A substrate storage cassette positioning device according to a third aspect of the present invention is a substrate storage cassette positioning device according to either one of the first aspect and the second aspect of the present invention, wherein the substrate storage cassette (43) is positioned from above into a predetermined location on an installation platform (40, 41); the installation platform (40, 41) comprises a retaining member (55) for retaining the substrate storage cassette (43) in a predetermined location; the guide section (59) is made up of a sloped surface formed on the retaining member (55); and the substrate storage cassette (43) is guided into a predetermined location by the peripheral section of the bottom surface of the substrate storage cassette (43) contacting the sloped surface.

Consequently, in a substrate storage cassette positioning device of the present invention, when the substrate storage cassette (43) is installed from above onto an installation platform (40, 41), the peripheral section of the bottom surface of the substrate storage cassette (43) contacts the sloped surface of the guide section (59) of the retaining member (55) and is guided into a predetermined location, and is then retained in this predetermined location by the retaining member (55).

A substrate storage cassette positioning device according to a fourth aspect of the present invention is a substrate storage cassette positioning device according to either one of the first aspect and the second aspect of the present invention, wherein the substrate storage cassette (43) is positioned from above into a predetermined location on an installation platform (40, 41); the installation platform (40, 41) comprises a retaining member (55) for retaining the substrate storage cassette (43) in a predetermined location; the guide section (59) is made up of a sloped surface formed on the peripheral section of the bottom surface of the substrate storage cassette (43); and the substrate storage cassette (43) is guided into a predetermined location by the sloped surface formed on the substrate storage cassette (43) contacting the retaining member (55).

Consequently, in a substrate storage cassette positioning device of the present invention, when the substrate storage cassette (43) is installed from above onto an installation platform (40, 41), the sloped surface formed on the peripheral section of the bottom surface of the substrate storage cassette (43) contacts the retaining member (55) and is guided into a predetermined location, and is then retained in this predetermined location by the retaining member (55).

A substrate storage cassette positioning device according to a fifth aspect of the present invention is a substrate storage cassette positioning device according to either one of the third aspect and the fourth aspect of the present invention, wherein a suction mechanism (61) for suctioning dust from the top of the installation platform (40, 41) is provided near the retaining member (55).

Consequently, in a substrate storage cassette positioning device of the present invention, when the substrate storage cassette (43) is installed onto an installation platform (40, 41), then even if dust is generated when the substrate storage cassette (43) contacts the guide section (59), the dust can be suctioned off and expelled by the nearby suction mechanism (61).

A substrate storage cassette positioning device according to a sixth aspect of the present invention is a substrate storage cassette positioning device according to any one of the first aspect through the fifth aspect of the present invention, wherein an impact absorption material is provided on either the peripheral section of the bottom surface of the substrate storage cassette (43) or on the guide section (59), for softening the impact when the substrate storage cassette (43) contacts the guide section (59).

Consequently, in a substrate storage cassette positioning device of the present invention, when the substrate storage cassette (43) is installed onto an installation platform (40, 41), even if the substrate storage cassette (43) contacts the guide section (59), the impact on contact is softened by the impact absorption material, enabling a reduction in the dust generated at the time of contact.

A substrate storage cassette positioning device according to a seventh aspect of the present invention is a substrate storage cassette positioning device according to the first aspect of the present invention, wherein the guide section (59) is provided on at least one of the installation platform and the substrate storage cassette.

A substrate storage cassette positioning device according to an eighth aspect of the present invention is a substrate storage cassette positioning device according to the seventh aspect of the present invention, wherein the guide section (59) is a sloped surface of an attached member which is attached to the installation platform.

A substrate storage cassette positioning device according to a ninth aspect of the present invention is a substrate storage cassette positioning device according to the eighth aspect of the present invention, wherein the guide section (59) is a sloped surface formed on the substrate storage cassette.

A substrate storage cassette positioning device according to a tenth aspect of the present invention is a substrate storage cassette positioning device according to the first aspect of the present invention, wherein positioning at a predetermined location is carried out through the engagement of a first engagement member (53) which is provided on the substrate storage cassette, and a second engagement member (54) which is provided on an installation platform and which engages with the first engagement member (53).

An exposure apparatus according to an eleventh aspect of the present invention is an exposure apparatus which uses light from an illumination system for transferring an image of a pattern of a mask (25) through a projection optical system (24) and onto a substrate (22), wherein a positioning device (42) for a substrate storage cassette (43) according to any one of the first aspect through the tenth aspect of the present invention is provided for positioning the substrate storage cassette (43), with the substrate (22) stored therein, at a predetermined location on an installation platform (40, 41).

Consequently, in an exposure apparatus of the present invention, when the substrate storage cassette (43) is installed onto an installation platform (40, 41), the substrate storage cassette (43) is guided into a predetermined location on the installation platform (40, 41) by a positioning device (42) according to any one of the first aspect through the tenth aspect of the present invention.

A method of transporting a substrate storage cassette (43) to a predetermined location on an installation platform (40, 41) according to a twelfth aspect of the present invention, wherein the peripheral surface of the substrate storage cassette (43) and an attached member provided on the installation platform are brought in contact, and the substrate storage cassette (43) is then moved to the predetermined location.

BRIEF DESCRIPTION OF THE DRAWINGS

FIGS. 6A and 6B are diagrams showing an embodiment of the present invention, in which

BEST MODE FOR CARRYING OUT THE INVENTION

As follows is a description of a first embodiment of an exposure apparatus and a substrate storage cassette positioning device according to the present invention, with reference to FIG. 1 through FIG. 6.

Figure 2:
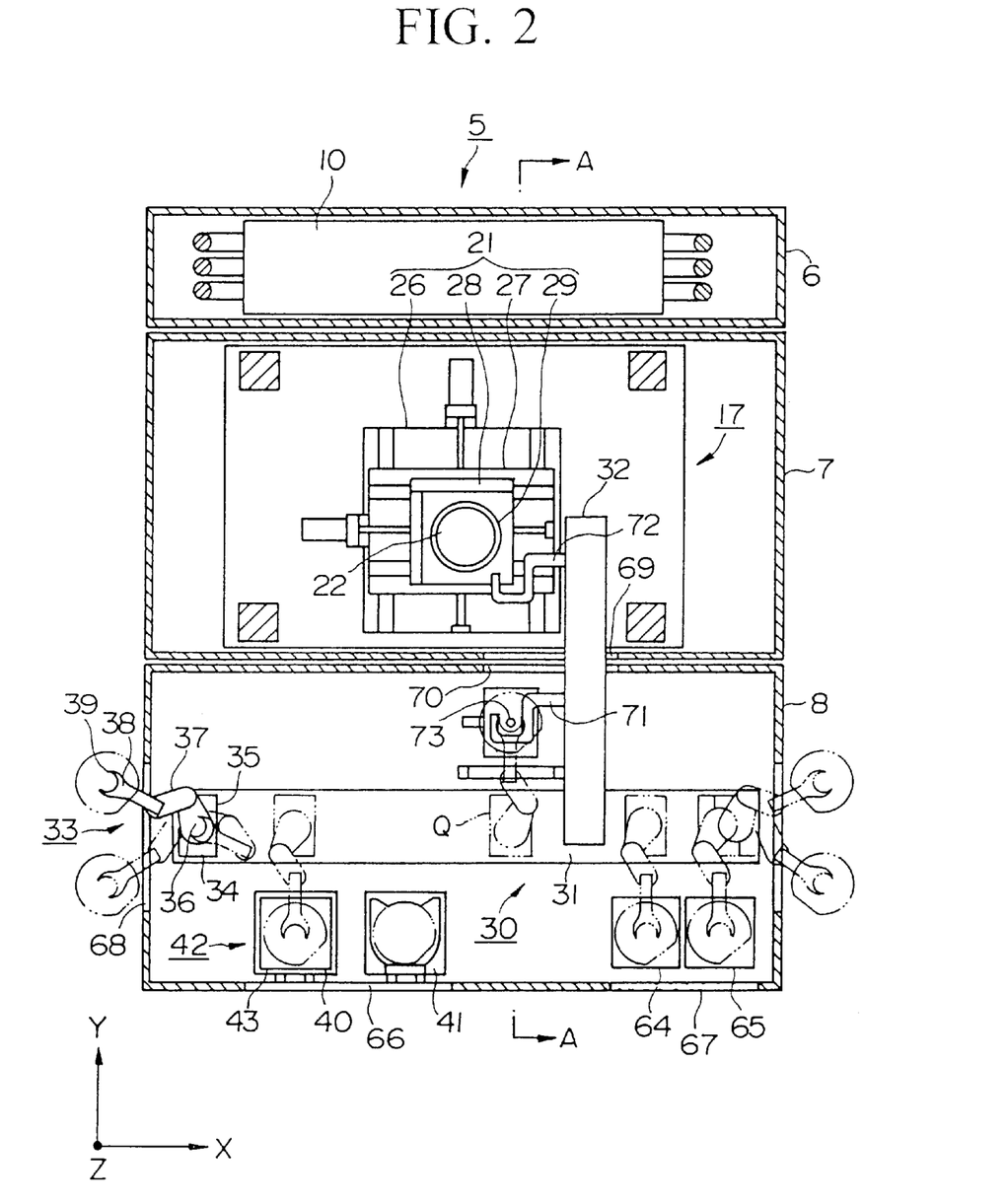
FIG. 2 is a plan cross-sectional view of an embodiment of the present invention, showing an exposure apparatus provided with a wafer cassette positioning device.
Figure 3:
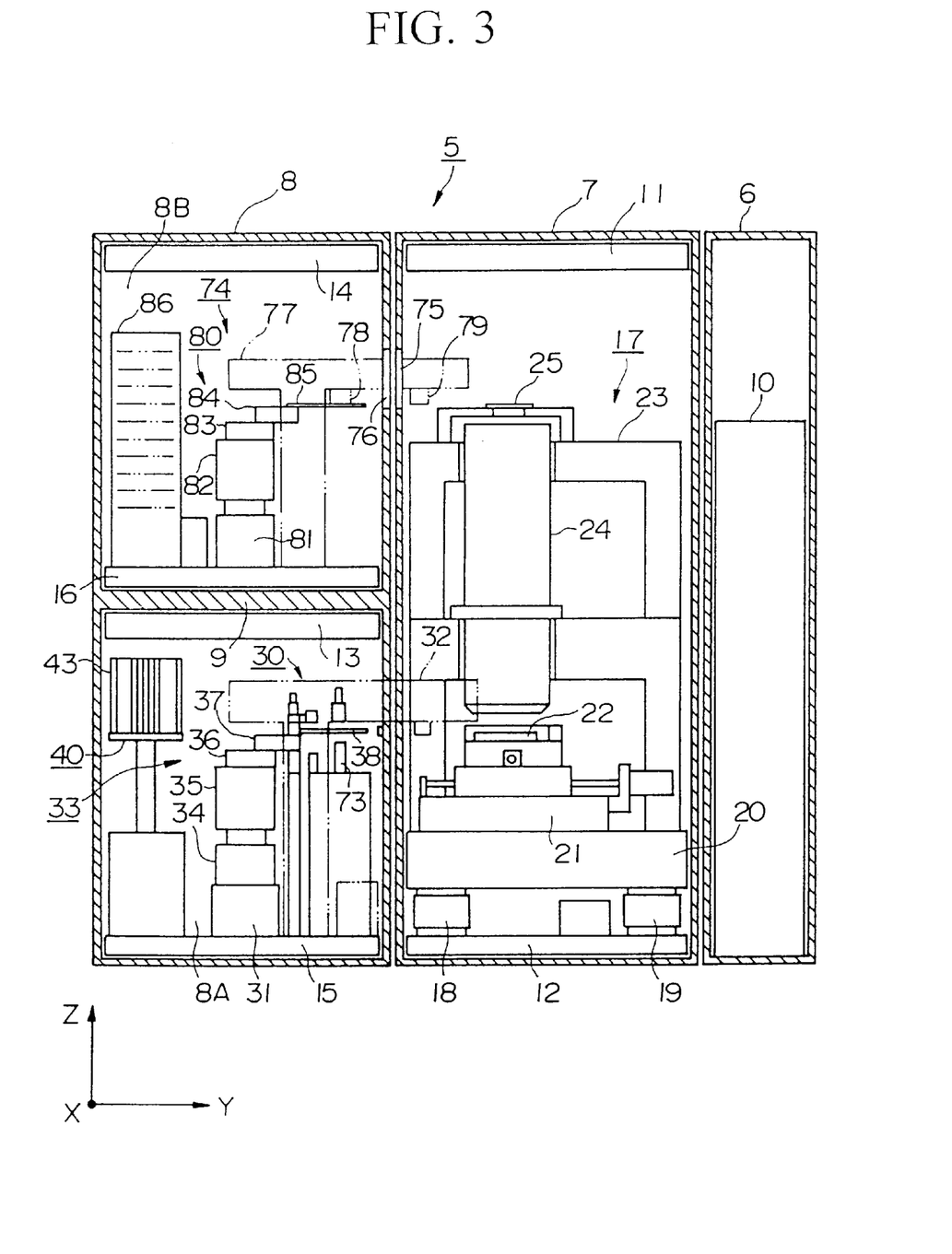
FIG. 3 is a cross-sectional view along the line A—A of FIG. 2.

FIG. 2 is a plan cross-sectional view of an exposure apparatus, and FIG. 3 is a cross-sectional view along the line A—A of FIG. 2, with numeral 5 representing the exposure apparatus.

The exposure apparatus 5 is constructed of mutually independent chambers 6, 7, 8, which are aligned sequentially, and as is shown in FIG. 3, the independent chamber 8 is separated into a lower chamber 8A and an upper chamber 8B by a divider 9.

An air conditioner 10 is installed within the independent chamber 6, and inside the air conditioner 10 is an air conditioning unit (not shown in the figure) for adjusting the temperature of the air.

Furthermore, the air conditioner 10 is constructed so as to execute down flow of the air which has undergone temperature adjustment by the air conditioning unit, through a dust removal filter 11 provided in the ceiling of the independent chamber 7, and into the independent chamber 7, as well as recycling air to the air conditioning unit from a return 12 installed in the floor of the independent chamber 7.

The air conditioner 10 is also constructed so as to also execute down flow of air into both the lower chamber 8A and the upper chamber 8B, through filters 13, 14 provided in the ceiling of the respective chambers, as well as recycling air to the air conditioning unit from returns 15, 16 installed in the floors of the respective chambers 8A, 8B.

An exposure apparatus main body 17 is installed inside the independent chamber 7.

The exposure apparatus main body 17 is basically constructed of a vibration proof base 20 which is installed onto the floor of the independent chamber 7 via vibration proof pads 18, 19, a wafer stage 21 which is mounted on top of the vibration proof base 20, and at the time of exposure onto which is loaded a wafer (substrate) 22 to which has been applied a photoresist, a column 23 which sits upright on top of the vibration proof base 20, a projection optical system 24 which is fixed to a point midway up the column 23, a reticle holder (not shown in the figure) which is provided on the upper edge section of the column and onto which is mounted a reticle (mask) 25, and an illumination system (not shown in the figure).

As is shown in FIG. 2, the wafer stage 21 comprises a base 26, a Y stage 27, an X stage 28 and a wafer holder 29, and is constructed so that a wafer 22 which is to undergo exposure is retained on top of the wafer holder 29 by vacuum suction.

A notched section known as an orientation flat (or notch) is formed on the periphery of the wafer 22, and the wafer 22 is loaded and set onto the wafer holder 29 with a wafer loader system 30 so that the notched section of the wafer 22 faces in a predetermined direction, and moreover so that the center of the wafer 22 is set with a predetermined positional relationship relative to the wafer holder 29.

The wafer loader system 30 is provided inside the lower chamber 8A of the independent chamber 8, and comprises a guide section constructed of a sideways slider body 31 which extends in the X direction, and a lengthwise slider body 32 which extends in the Y direction.

A robot hand 33 which is able to slide freely in the X direction is positioned on top of the sideways slider body 31.

The robot hand 33 comprises an X axial movement section 34 for movement along the sideways slider body 31 in the X direction, a Z axial movement section 35 positioned on top of the X axial movement section 34 which can be freely expanded or contracted in the Z direction perpendicular to the XY plane, a θ axial rotation section 36 for rotation about an axis down the center of the Z axial movement section, an R axial rotation section 37 which is provided at the tip of the θ axial rotation section 36 and can be freely rotated about the tip, and a hand section 38 which is provided at the tip of the R axial rotation section 37 and is able to be freely rotated about the tip, and moreover a vacuum suction section 39 is attached to the tip portion of the hand section 38.

The hand section 38 is constructed so that when the θ axial rotation section 36 is rotated the hand section 38 can be freely rotated in a θ direction, and so that by combining the R axial rotation section 37 and the rotational angle of the hand section 38, the position from the center of the hand section 38 in a radial direction (R direction) is able to be adjusted.

Furthermore, installation platforms 40, 41 are positioned to the side of the sideways slider body 31 at a predetermined positional relationship relative to the robot hand 33.

Then, a wafer cassette (substrate storage cassette) 43 is mounted onto the installation platforms 40, 41 and positioned in a predetermined location on the installation platforms 40, 41 by the positioning device 42.

The positioning devices 42 on the installation platforms 40, 41 are of an identical construction, and so only the positioning device 42 on the installation platform 40 is described below.

Figure 1:
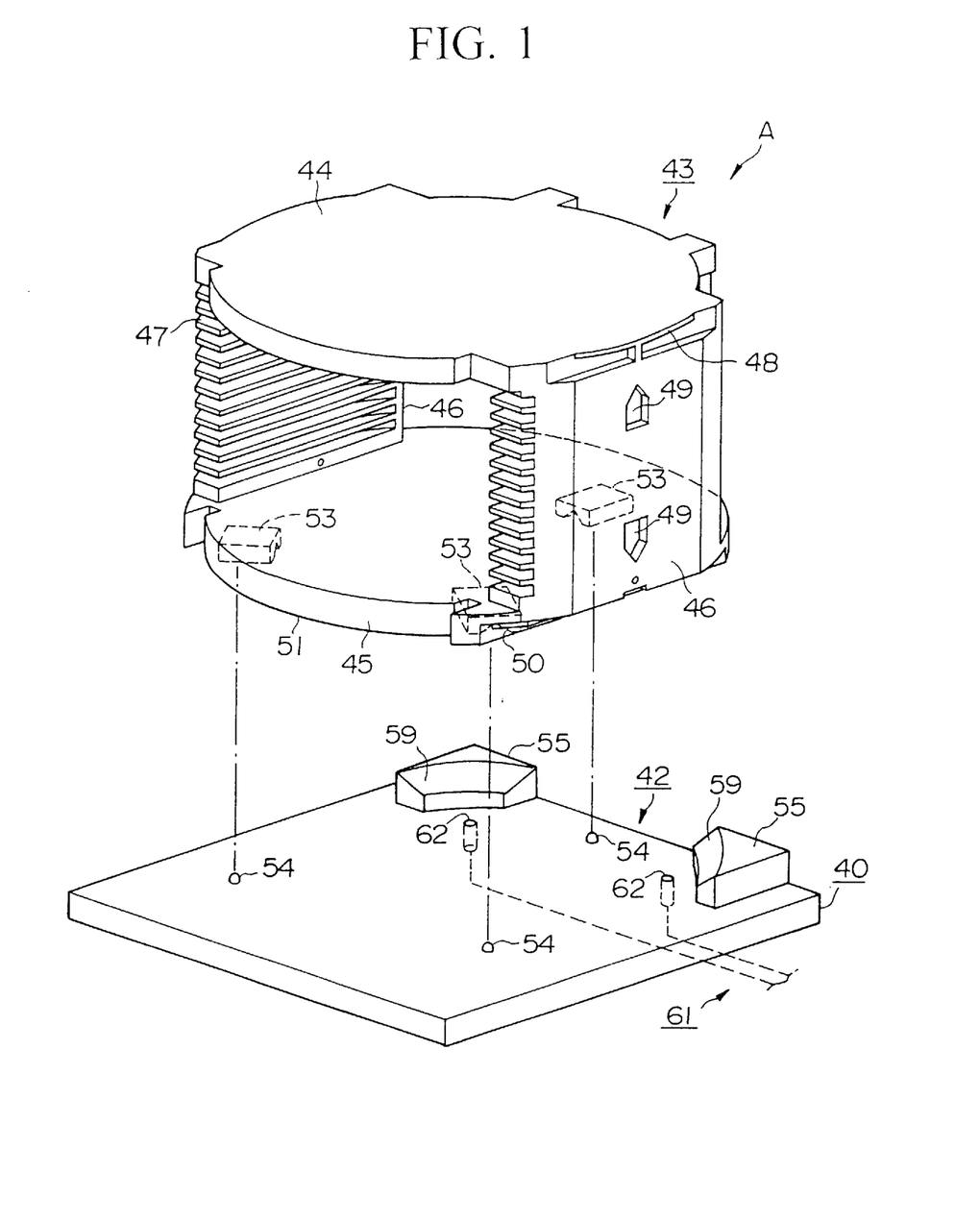
FIG. 1 is an external perspective view of an embodiment of the present invention, showing an installation platform and a wafer cassette to be positioned by a positioning device.

As shown in FIG. 1, the wafer cassette 43 comprises a top wall section 44, a bottom wall section 45 which opposes the top wall section 44, and side wall sections 46 which are formed between the top wall section 44 and the bottom wall section 45. The top wall section 44 is provided at one end of the side wall sections 46, and the bottom wall section 45 is provided at the opposite end of the side wall sections 46.

In each side wall section 46 are formed slots 47 for storing wafers 22 horizontally.

Furthermore, at one end of the side wall sections 46 is formed a holding flange 48 which is held by a transfer robot not shown in the figure. Side clip pits 49 for the transfer robot to hold are also formed at positions between the two opposing ends of the side wall section 46.

A fork slot 50 into which the fork of the transfer robot is inserted is formed at one edge of the bottom wall section 45.

The fork slot 50 is formed so as to extend in the direction in which the wafer 22 is loaded.

When a wafer cassette 43 constructed in the above manner is held by the transfer robot, the fork of the transfer robot is inserted into the fork slot 50 of the wafer cassette 43, and holding arms on the robot are also engaged in the holding flange 48 and the side clip pits 49. In this manner, the transfer robot carries out the transport of the wafer cassette 43 onto, and away from the installation platforms 40, 41.

The positioning device 42 comprises slot members 53 (first engagement members) provided on the bottom surface peripheral section 51 of the bottom wall section 45 of the wafer cassette 43, kinematic coupling pins 54 (second engagement members) provided on the installation platforms 40, 41, and retaining members 55 provided on top of the installation platforms 40, 41, which form guide sections for guiding the wafer cassette 43 into a predetermined location as well as retaining the wafer cassette 43 in that predetermined location.

Figure 4:
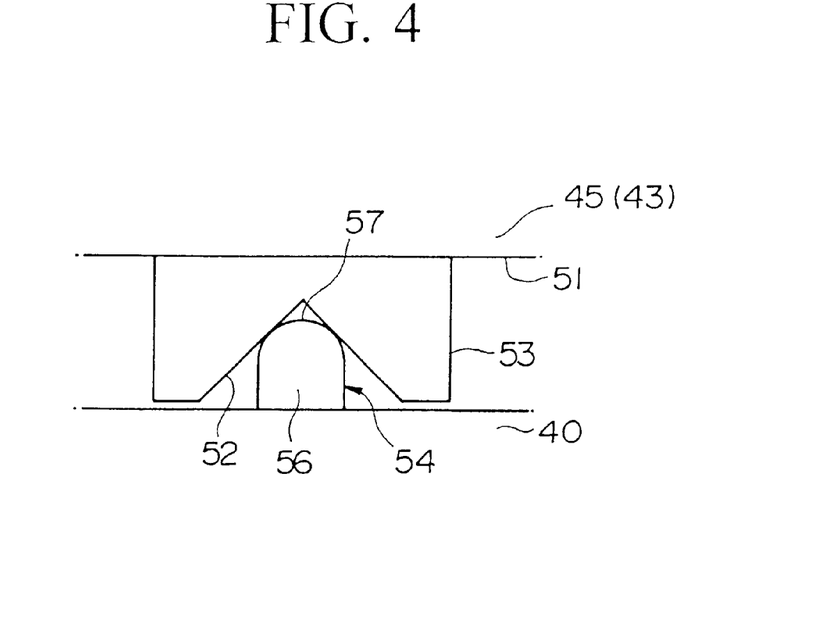
FIG. 4 is a plan view of an embodiment of the present invention, showing the engagement of a V shaped slot of a slot member with a spherical surface portion of a kinematic coupling pin.
Figure 6A:
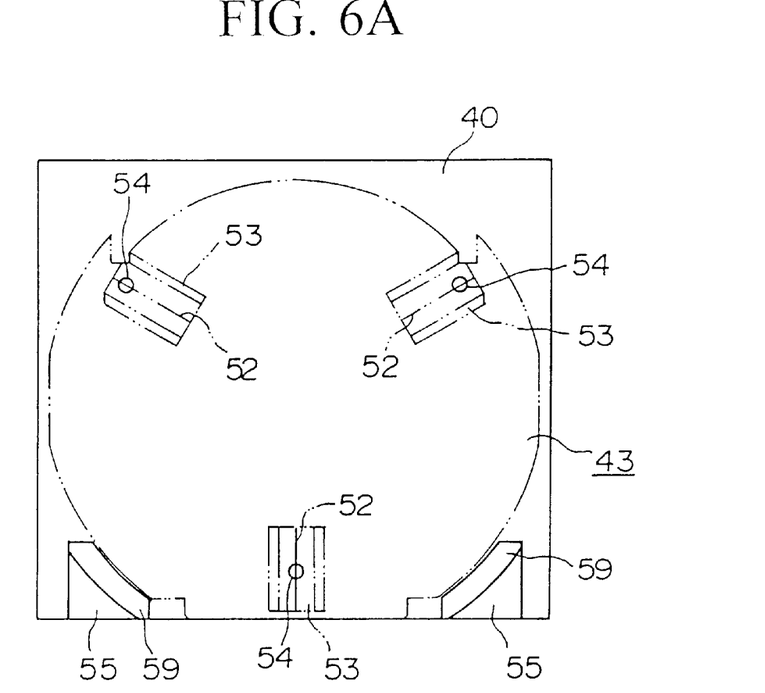
FIG. 6A represents a plan view showing radially extending kinematic coupling pins provided at an interval of 120° on an installation platform.

As is shown in FIG. 4, the slot members 53 comprise a V shaped slot (a concave portion) 52 which widens out in a downward direction, and as is shown in FIG. 6(a) the V shaped slots 52 are provided at three positions at an interval of 120° and extend radially outwards. The V shaped slots 52 widen out at an angle of 90°.

Figure 6B:
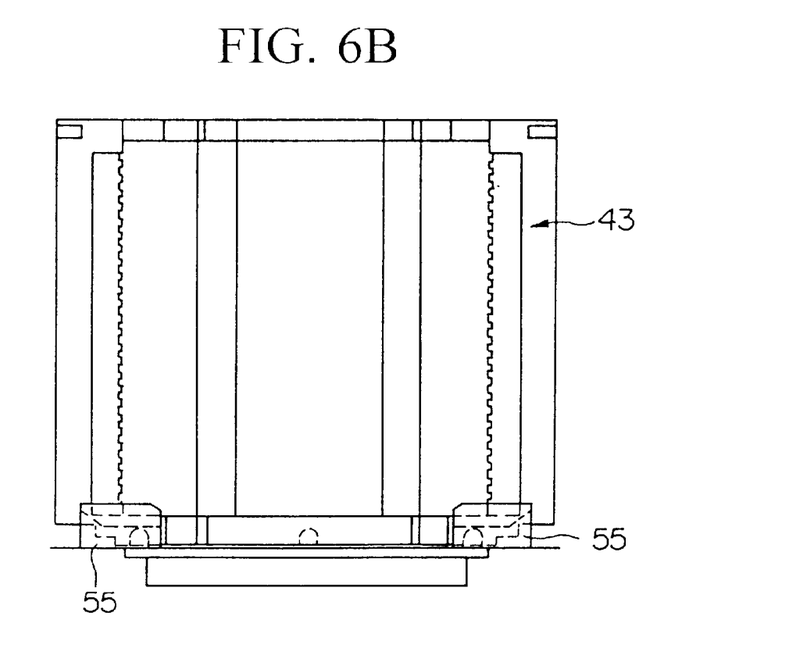
FIG. 6B represents a front view showing a wafer cassette installed onto the installation platform.

Furthermore, the external shape of the wafer cassette 43, and in particular the portion which is retained by the retaining member 55, comprises a curvature (a circular arc surface), and the retaining surface 58 of the retaining member 55 has a corresponding curvature (refer to FIG. 6). That is, the retaining surface 58 of the retaining member 55 has a shape which corresponds with the outer diameter of the wafer cassette.

As is shown in FIG. 4, the kinematic coupling pins 54 comprise an axial portion 56 of an approximate diameter of 12 mm which protrudes above the surface of the installation platform 40, and a spherical surface portion (convex portion) 57 of an approximate radius of 15 mm which is formed at the tip of the axial portion 56 and which will freely engage inside the V shaped slot 52 of the slot members 53, and are positioned in three locations to correspond with the V shaped slots 52 (refer FIG. 6).

Furthermore, the V shaped slots 52 and the spherical surface portions 57 are constructed so that on mutual engagement, the slot members 53 will be clear of the surface of the installation platforms 40, 41 by approximately 2 mm.

The retaining members 55 support the retention of the wafer cassette 43 once it has been positioned in the predetermined location, whereas the sloped surfaces 59 contact the wafer cassette 43 and guide the cassette into the predetermined location during positioning of the wafer cassette 43 down onto the installation platform 40.

The predetermined location described above is the location at which the V shaped slots of the slot members 53 provided on the bottom surface peripheral section of the wafer cassette 43, and the kinematic coupling pins 54 provided on the installation platforms 40, 41 mutually engage.

Moreover in the embodiment described, the retaining members 55 were constructed so as to be involved in positioning support in combination with the kinematic coupling pins and the wafer cassette 43, and actually retain the wafer cassette 43, but the retaining surface 58 of the retaining member 55 is not necessarily a requirement of the present invention. That is, the retaining members 55 may also be constructed with only a sloped surface (guide surface). Consequently, with a retaining member comprising only a sloped surface, the retaining member simply corresponds to an attached member on the installation platforms 40, 41.

The retaining members 55 are provided in two locations on the opposite edge of the installation platforms 40, 41 to the side where a wafer 22 is loaded, and as is shown in FIG. 6(a) comprise a retaining surface 58 which either contacts the edge surface of the wafer cassette 43, or alternatively faces the edge surface of the wafer cassette 43 with a clearance of several mm, and a sloped surface (guide surface) 59 which guides the wafer cassette 43 into a predetermined location during positioning of the wafer cassette 43 into that predetermined location. The sloped surface 59 is also known as a guide surface for guiding the wafer cassette into the predetermined location, and in order to direct the wafer cassette 43 into the predetermined location, the sloped surface 59 faces towards the central portion of the installation platform 40 and is sloped so as to widen out in the aforementioned upwards direction.

Figure 5:
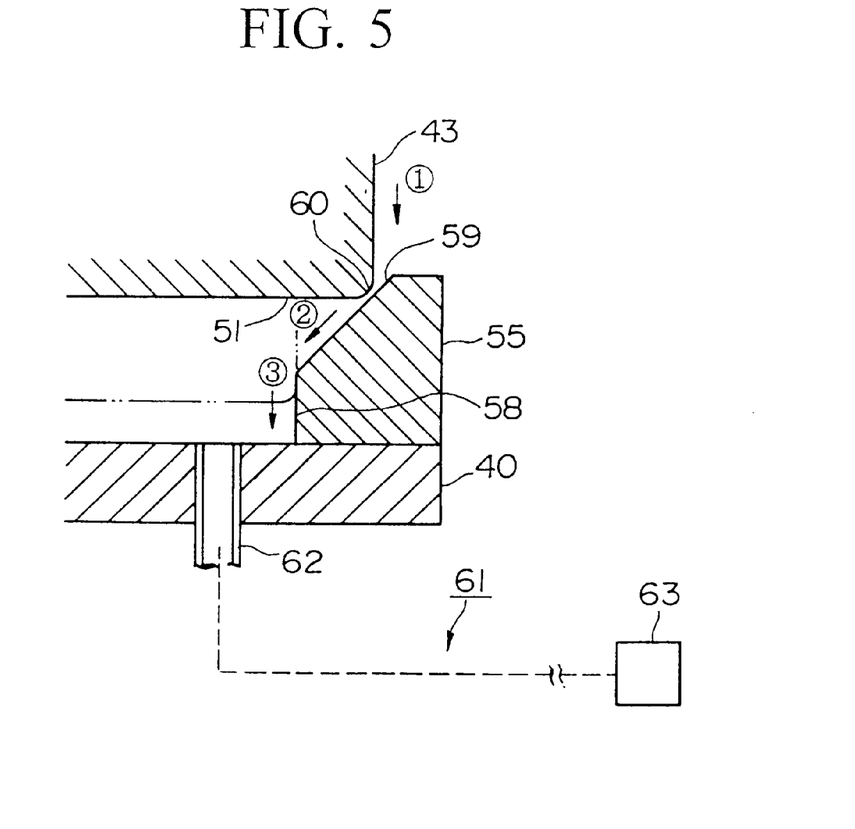
FIG. 5 is a cross-sectional view of an embodiment of the present invention, in which a guide member and a dust removal device are provided on an installation platform.

Furthermore, as shown in FIG. 5, a stress relaxation surface 60 is formed on the bottom surface peripheral section 51 of the wafer cassette 43 for softening the stress concentration generated when the wafer cassette 43 contacts the sloped surface 59.

The stress relaxation surface may be a tapered surface formed by removing the corner of the bottom surface peripheral section 51, or a circular arc surface formed by rounding the corner.

A dust removal device (suction mechanism) 61 is also provided near the retaining member 55 for suctioning off and removing any dust which is generated when the wafer cassette 43 and the retaining member 55 come in contact.

The dust removal device 61 basically comprises a suction tube 62 with an opening near the retaining member 55 of the installation platform 40, and a negative pressure suction source 63 for suctioning out the contents of the suction tube 62 under negative pressure.

Returning to FIG. 2, temporary holding platforms 64, 65 for temporarily mounting wafers 22 are installed to the side of the sideways slider body 31, and a plurality of wafer mounting pins are provided on top of these temporary holding platforms 64, 65.

Furthermore, apertures 66, 67, 68 for conducting exchanges from externally of the wafer cassette 43 and the like are provided in the side surface of the independent chamber 8 close to the installation platforms 40, 41 and the temporary holding platforms 64, 65.

The lengthwise slider body 32 protrudes into the independent chamber 7 through an aperture 69 provided in the side surface of the independent chamber 7 and an aperture 70 provided in the side surface of the lower chamber 8A of the independent chamber 8.

Sliders 71, 72, which appear hook shaped in a plan view thereof, are provided on the side surface of the lengthwise slider body 32 and are able to freely slide along the length of the body.

The sliders 71, 72 are able to hold a wafer 22 by vacuum suction, and are able to move independently between the inside of the independent chamber 7 and the independent chamber 8A.

Furthermore, a turntable 73 which is able to be moved up and down is provided below the sliders 71, 72 and to the side of the sideways slider body 31.

A reticle loader system 74 is installed inside the upper chamber 8B of the independent chamber 8.

The reticle loader system 74 has a guide section comprising a lengthwise slider body 77, and this lengthwise slider body 77 protrudes into the independent chamber 7 through an aperture 75 in the independent chamber 7 and an aperture 76 in the upper chamber 8B.

Sliders 78, 79 which are able to slide freely along the length of the lengthwise slider body 77 are attached to the lengthwise slider body 77, and a robot hand 80 is also provided nearby.

The robot hand 80 comprises a base 81, a Z axial movement section 82 positioned on top of the base 81 which can be expanded or contracted in the Z direction perpendicular to the XY plane, a θ axial rotation section 83 for rotation about an axis down the center of the Z axial movement section 82, an R axial rotation section 84 which is provided at the tip of the θ axial rotation section 83 and can be freely rotated about the tip, and a hand section 85 which is provided at the tip of the R axial rotation section 84 and is able to be freely rotated about the tip.

A storage rack 86 for storing reticles is provided near the robot hand 80.

For an exposure apparatus and a substrate storage cassette positioning device of the above construction, as follows is first a description of the action of the substrate storage cassette positioning device.

First, the wafer cassette 43, with a wafer 22 stored in the slot 47, is transported to a position near the independent chamber 8 of the exposure apparatus 5.

Next, a transfer robot grasps the holding flange 48 and the side clip pits 49 of the wafer cassette 43, and the fork of the transfer robot slides into the fork slot 50, and the wafer cassette 43 is supported and then lifted up from below.

In this state, the wafer cassette 43 is then inserted horizontally through the aperture 66 of the independent chamber 8 and into the inside of the independent chamber 8.

At this point, the wafer cassette 43 is supported by the fork at both sides of the bottom wall section 45, and is also held via the holding flange 48 and the side clip pits 49 provided in both side wall sections 46, and so is inserted with no positional variation in the rotational direction.

Next, the positioning of the wafer cassette 43 is described, based on FIG. 5. As is shown in FIG. 5, horizontal movement of the wafer cassette 43 is stopped slightly before the wafer cassette 43 reaches a position directly above the predetermined location relative to the installation platform 40.

In this case, a position slightly before the wafer cassette 43 is directly above the predetermined location may be any position above the sloped surface (guide surface) 59 formed on the retaining member 55.

Furthermore, when the transfer robot lowers the wafer cassette 43 from the aforementioned position slightly before the predetermined location, then partway through the descent the wafer cassette 43 will start moving along the sloped surface 59 in a diagonal direction. Consequently for the descent, it is desirable that the transfer robot is able to extend and contract in a direction orthogonal to the direction of the descent.

Subsequently, as shown in FIG. 5, when the wafer cassette 43 is lowered down from above the installation platform 40 (state (1)), the edge portion 60 of the bottom surface peripheral section 51 will contact the sloped surface 59 of the retaining member 55 and the wafer cassette 43 will slide down the sloped surface 59 (state (2)). Then the wafer cassette 43 drops into the positioning space formed by the two retaining members 55 (state (3)), and is guided by the retaining surface 58 and finally positioned in the predetermined location. FIG. 6(a) and FIG. 6(b) show the wafer cassette 43 installed on the installation platform 40.

As is shown in FIG. 4, the V shaped slots 52 of the slot members 53 provided on the wafer cassette 43, engage with the spherical surface portions 57 of the kinematic coupling pins 54 provided on the installation platform 40, thereby positioning the wafer cassette 43 in a predetermined location on top of the installation platform 40. At this point there is a small gap (approximately 2 mm) between the slot members 53 and the installation platform 40.

In this manner, the wafer cassette 43 is positioned in a predetermined location via the sloped surface 59 of the retaining members 55.

Moreover at this point, because a stress relaxation surface 60 is formed on the bottom surface peripheral section 51 of the wafer cassette 43, not only will the wafer cassette 43 slide smoothly along the sloped surface 59, but because the stress concentration resulting from the contact is softened, dust generation at this contact point is also able to be suppressed.

Furthermore, the minute amount of dust which may still be produced, is suctioned out through the suction tube 62 by the negative pressure suction source 63, and removed.

As follows is a description of the action of the exposure apparatus 5.

As shown in FIG. 2 and FIG. 3, after removing a wafer 22 from the wafer cassette 43 positioned on the installation platform 40, the robot hand 33 moves to a position Q and passes the wafer 22 to either the slider 71 or the slider 72 via a turntable 73.

With the wafer 22 held by vacuum suction, the slider 71, 72 loads the wafer 22 into a predetermined location on the wafer holder 29 of the wafer stage 21.

Exposure light from the illumination system of the exposure apparatus is then used for transferring a pattern image from the reticle 25, through the projection optical system 24, and onto the wafer 22, which is retained on the wafer holder 29 by vacuum suction.

With the pattern image transferred thereon, the wafer 22 is then reloaded onto either the slider 71 or the slider 72, and is passed back to the robot hand 33 via the vertical movement of the turntable 73.

The robot hand 33 then returns the wafer 22 to the wafer cassette 43, for example.

In contrast, in the setting of the reticle 25, the reticle 25 is removed from the storage rack 86 using vacuum suction from the hand section 85 of the robot hand 80, and the removed reticle 25 then passed to either the slider 78 or the slider 79 of the lengthwise slider body 77.

Subsequently, with the reticle held by vacuum suction, the slider 78 or the slider 79 is moved into the independent chamber 7 along the lengthwise slider body 77, and the reticle 25 is then installed, via a reticle delivery device not shown in the figures, onto a reticle holder on the column 23 of the exposure apparatus main body 17.

Furthermore, to exchange the reticle 25, the reticle 25 is removed from the reticle holder and returned to the storage rack 86 via either the slider 78 or the slider 79, and the robot hand 80.

The exchange process is then completed by installing a new reticle onto the reticle holder using the same operation as that described above.

In the installation of a wafer cassette 43 from above, using an exposure apparatus and a substrate storage cassette positioning device according to the present invention, because the wafer cassette 43 is guided down the sloped surface 59 of the retaining member 55, the positioning of the wafer cassette 43 into a predetermined location on the installation platform 40 can be carried out simply and reliably, even if the transportation precision of the transfer robot is not particularly high.

That is, during installation of the wafer cassette from above, the positional relationship between the wafer cassette 43 and the retaining member 55 can vary provided the bottom surface peripheral section 51 of the wafer cassette 43 is within the surface plane of the sloped surface 59. Positioning of the wafer cassette 43 with this degree of precision can be achieved comfortably even by transfer robots which do not possess a high degree of transportation precision.

Furthermore, even in the case where a transfer robot is not used, and the transfer is performed by an operator, the transfer operation can be completed simply and within a short time frame.

Furthermore, because a stress relaxation surface 60 is formed on the bottom surface peripheral section 51 of the wafer cassette 43, the amount of dust generated when the wafer cassette 43 contacts the sloped surface 59 of the retaining member 55 and then slides smoothly down the sloped surface, can be suppressed to a minimum.

In addition, any minimal amount of dust which is generated can be removed by the dust removal device 61, and so the wafer storage space inside the wafer cassette 43 can be maintained in a very clean state with no accumulation of dust.

By positioning the wafer cassette 43 reliably into the predetermined location, damage resulting from interference or the like within the exposure apparatus 5 during loading of the wafer 22 by the robot hand 33 can be prevented.

Figure 9:
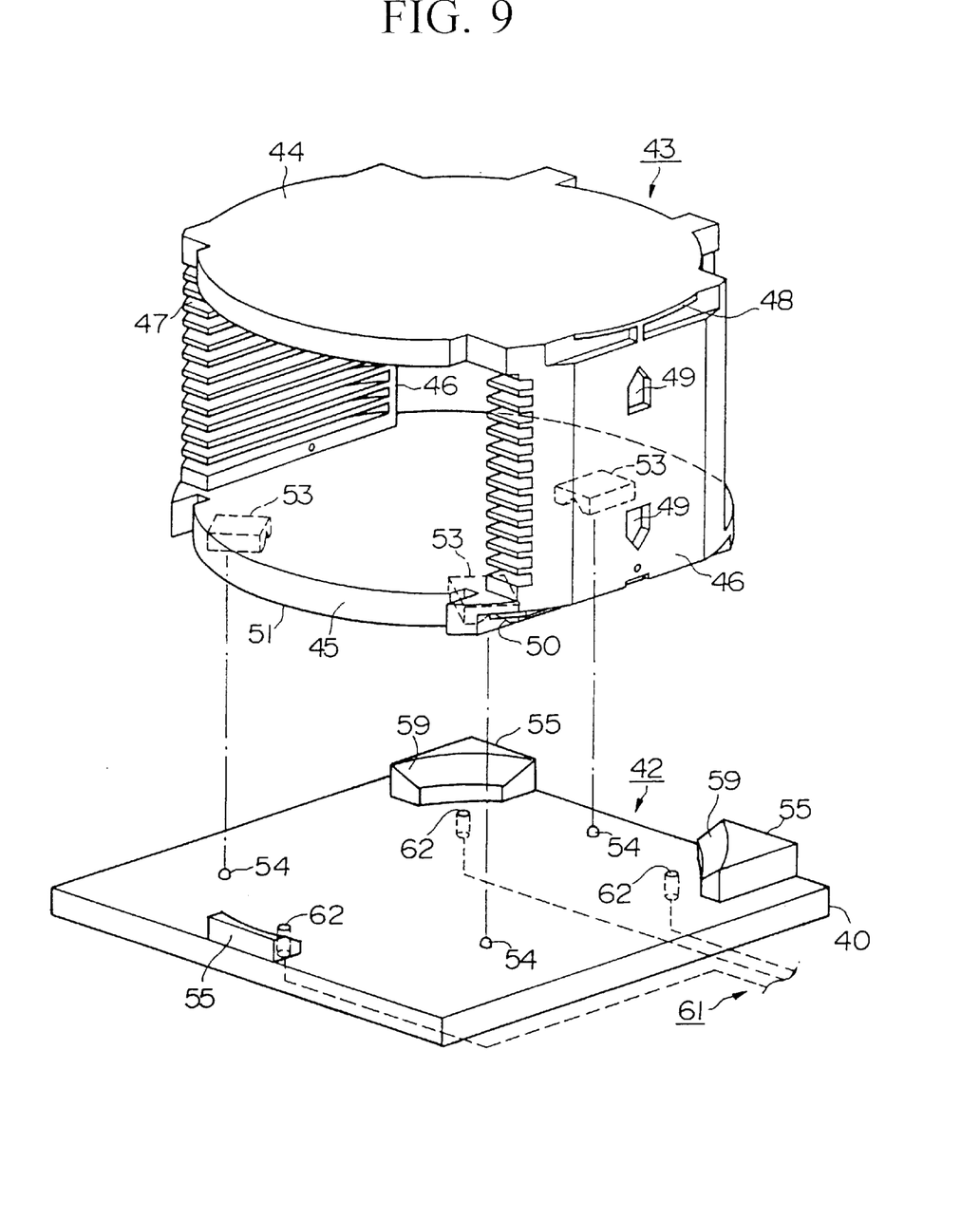
FIG. 9 is an external perspective view of an embodiment of the present invention, showing guide members provided in three locations on an installation platform.

FIG. 9 is a diagram showing a second embodiment of an exposure apparatus and a substrate storage cassette positioning device according to the present invention.

In the figure, those structural elements which are identical with the elements of the first embodiment shown in FIG. 1 through FIG. 6 are assigned the same numerals, and the descriptions thereof are omitted.

The point in which the second embodiment differs from the first embodiment described above, is in the provision of retaining members 55 in three locations.

That is, on the installation platform 40, one retaining member 55 is provided in a location on the side from which wafers 22 are loaded, and two further retaining members 55 are provided on opposing edges on the other side of the installation platform 40, and these three retaining members 55 are positioned in the spaces between the slot members 53 and the kinematic coupling pins 54.

The remaining construction is identical with that described for the first embodiment.

According to an exposure apparatus and a substrate storage cassette positioning device according to the second embodiment, not only are the same actions and effects as those described for the first embodiment achieved, but in addition, during transfer of the wafer cassette 43, regardless of the direction in which the wafer cassette 43 may be offset, the sloped surfaces 59 of the retaining members 55 will still be able to contact and guide the wafer cassette 43 into a predetermined location.

Moreover, exposure apparatus and substrate storage cassette positioning devices according to the present invention are not limited to the aforementioned embodiments, and may also incorporate the following types of alterations.

In the embodiments above, the construction was described in which the installation platform 40 was provided inside an independent chamber, but the present invention is not limited to this construction, and the installation platform 40 may also be provided outside the independent chamber and a robot hand used to load the wafer inside the chamber.

Furthermore, the positioning device of the above embodiments was constructed of slot members 53 provided on the bottom surface peripheral section 51 of the bottom wall section 45 of the wafer cassette 43, and kinematic coupling pins 54 provided on the installation platform 40, but the present invention is not limited to this construction, and for example, a construction in which the slot members 53 are provided on the installation platform 40 and the pins 54 are provided on the bottom wall section 45 is also possible.

In addition, in the above embodiments the positioning was carried out mechanically by using the pins 54 and the slot members 53, but magnetic positioning is also possible. In such a case, the south pole of a magnet is attached to the bottom wall section 45 of the wafer cassette 43, and a magnetic pole member for generating either a north pole or a south pole is provided on the installation platform 40. Then, during positioning, a north pole is generated at the magnetic pole member, and during removal of the wafer cassette 43 from the installation platform 40, a south pole is generated at the magnetic pole member.

Figure 7:
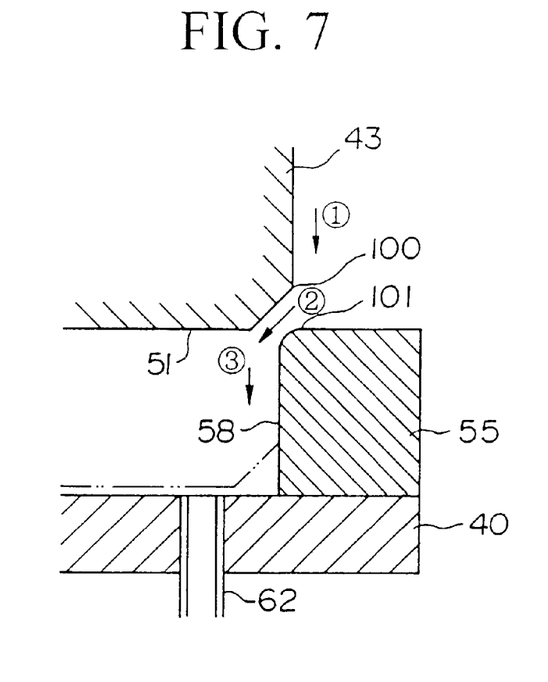
FIG. 7 is an operational diagram for an embodiment of the present invention, showing the positioning of a wafer cassette onto an installation platform.

Furthermore, the sloped sections 59 of the above embodiments were formed on the retaining members 55 provided on top of the installation platform 40, but the present invention is not limited to this type of construction, and for example a construction in which a sloped surface 100 is formed on the bottom surface peripheral section 51 of the wafer cassette 43, as shown in FIG. 7, is also possible.

That is, the sloped section 100 is formed so that the bottom surface peripheral section 51 of the wafer cassette 43 converges (reduces in surface area) in the direction of the descent onto the installation platform 40. In such a case, it is desirable that a stress relaxation surface 101 is formed on the retaining members 55 on the installation platform 40 for softening the stress concentration generated when the sloped surface 100 of the wafer cassette 43 contacts the retaining members 55. According to such a construction, when the wafer cassette 43 is lowered down onto the installation platform 40 (state (1)), the sloped surface 100 formed on the bottom surface peripheral section 51 of the wafer cassette 43 will slide down the stress relaxation surface 101 of the retaining members 55 (state(2)).

The wafer cassette 43 will then drop into the positioning space formed by at least two retaining members 55 (state (3)), and is guided by the retaining surface 58 and finally positioned in the predetermined location.

Figure 8:
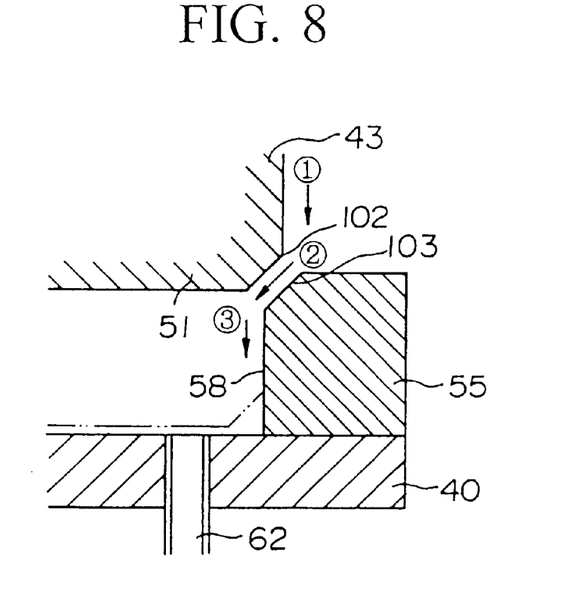
FIG. 8 is an operational diagram for an embodiment of the present invention, showing the positioning of a wafer cassette onto an installation platform.

In addition, a construction as shown in FIG. 8, in which a sloped surface is formed on both the bottom surface peripheral section 51 of the wafer cassette 43, and the retaining members 55, is also possible.

That is, a sloped surface 102 on the bottom surface peripheral section 51 of the wafer cassette 43 is formed so that the bottom surface peripheral section 51 converges (reduces in surface area) in the direction of the descent onto the installation platform 40, and a sloped surface 103 on the retaining members 55 is formed facing towards the central portion of the installation platform 40 and is sloped so as to widen out in an upwards direction. According to such a construction, when the wafer cassette 43 is lowered down onto the installation platform 40 (state (1)), the sloped surface 102 formed on the bottom surface peripheral section 51 of the wafer cassette 43 will contact the sloped surface 103 formed on the retaining members 55.

Subsequently, the sloped surface 102 of the wafer cassette 43 will slide down the sloped surface 103 of the retaining members 55 (state (2)).

The wafer cassette 43 will then drop into the positioning space formed by at least two retaining members 55 (state (3)), and is guided by the retaining surface 58 and finally positioned in the predetermined location.

Moreover, the sloped surface 102 of the wafer cassette 43 contacts the sloped surface 103 of the retaining members 55, but because the contact is between two planar surfaces, it could be assumed that the frictional resistance may be quite large.

In such a case it is desirable to provide a sliding agent on at least one of the surfaces. Examples of suitable sliding agents include silicon oil or the like.

Furthermore, in the embodiments of the present invention described above, the description of the guide sections focussed on sloped surfaces, but a completely linear slope is not necessarily required, and sloped surfaces with a slight curvature are also possible.

That is, during positioning of the wafer cassette 43 from above, provided a surface is provided down which the wafer cassette can slide into the predetermined location, then surfaces with a slight curvature or with slight irregularities are also possible.

Moreover in the above embodiments, a wafer storage cassette was described as an example of the object to undergo positioning, but the positioning of cassettes which store other substrates (such as reticles, masks, or glass substrates) is also possible.

In such a case, the present invention may be applied to storage containers for storing one substrate. Furthermore, the invention may also be applied to cassettes (U.S. Pat. Nos. 5,711,427 and 5,642,713) for storing a plurality of wafers inside a sealed space.

Furthermore, in the above embodiments, retaining sections were provided in either two or three locations on an installation platform, but four or more retaining sections, or a continuous ring shaped retaining section, may also be provided.

Chamfered or tapered type forms were described for the stress relaxation surface, but it is also desirable that an impact absorption material is provided on the bottom surface peripheral section of the cassette or on the guide surface for absorbing the impact generated upon contact.

As described above, for the positioning of a wafer cassette into a predetermined location, a positioning device according to the embodiments of the present invention can be assembled by joining, either mechanically or electrically, each of the elements comprising a positioning device.

Furthermore, an exposure apparatus according to the embodiments of the present invention which is equipped with the above type of positioning device can be assembled by joining, either mechanically or electrically, each of the elements comprising an exposure apparatus so as to enable the carrying out of the exposure operations described above.

The exposure apparatus described in the embodiments of the present invention may be either a scanning type exposure apparatus (U.S. Pat. No. 5,473,410) in which a mask and a substrate are moved synchronously while a mask pattern is exposed, or a step and repeat type exposure apparatus in which a mask pattern is exposed with a mask and a substrate in a stationary state, and the substrate is then sequentially moved in steps.

Furthermore, the above embodiments were described assuming an exposure apparatus, but the present invention may be effectively applied to any apparatus equipped with a transportation mechanism for transporting a wafer or a reticle, such as an examination apparatus for examining a pattern formed on a wafer, a defect examination apparatus for detecting impurities or irregularities in the resist application on the wafer, or a pattern measurement apparatus for measuring the pattern on a reticle.

The present application also incorporates, as quoted, all the information, including the specification, the claims, the drawings and the abstract, disclosed in Japanese Patent Application No. Hei-10-23565, submitted on Feb. 4, 1998.

INDUSTRIAL APPLICABILITY

As described above, a substrate storage cassette positioning device according to the first aspect of the present invention is provided with guide sections for guiding the substrate storage cassette into a predetermined location during the positioning of the substrate storage cassette into a predetermined location on an installation platform.

Consequently, a superior effect of the present invention is that, in the case of a robot, the positioning of the wafer cassette into a predetermined location on the installation platform can be carried out simply and reliably even if the transfer precision of the robot is not particularly high, and even in the case where an operator performs the transfer, the operation can be completed quickly and simply.

In a substrate storage cassette positioning device according to the second aspect of the present invention, positioning concave portions are provided on the bottom surface of a substrate storage cassette, and convex portions which engage freely with these concave portions are provided on the top of an installation platform.

Consequently, in the case where, for example, the substrate storage cassette is positioned onto the installation platform via kinematic coupling, the present invention displays the superior effect of enabling even more reliable and simple positioning into a predetermined location.

In a substrate storage cassette positioning device according to the third aspect of the present invention, a sloped surface is provided on a retaining member for guiding a substrate storage cassette into a predetermined location when the bottom surface peripheral section of the substrate storage cassette contacts the sloped surface during positioning of the substrate storage cassette from above.

Consequently, the substrate storage cassette slides down the sloped surface, thereby displaying the superior effect of enabling even more reliable and simple positioning into a predetermined location on an installation platform.

In a substrate storage cassette positioning device according to the fourth aspect of the present invention, a sloped surface is provided on a bottom surface peripheral section of a substrate storage cassette for guiding the substrate storage cassette into a predetermined location when the bottom surface peripheral section contacts the sloped surface during positioning of the substrate storage cassette from above.

Consequently, the substrate storage cassette slides down the sloped surface, thereby displaying the superior effect of enabling even more reliable and simple positioning into a predetermined location on an installation platform.

In a substrate storage cassette positioning device according to the fifth aspect of the present invention, a suction mechanism for suctioning off dust from the top of an installation platform is provided near a retaining member.

Consequently, the present invention displays the superior effect of maintaining the substrate vicinity in a very clean state, even when the substrate storage cassette contacts a guide section.

In a substrate storage cassette positioning device according to the sixth aspect of the present invention, an impact absorption material is provided on either the bottom surface peripheral section of a substrate storage cassette, or on a guide section, for softening the impact when the substrate storage cassette contacts the guide section.

Consequently, the present invention displays the superior effect of suppressing dust generation to a minimum and maintaining the substrate vicinity in a clean state, even when the substrate storage cassette contacts the guide section.

In an exposure apparatus according to the eleventh aspect of the present invention, an exposure apparatus is provided which is equipped with a substrate storage cassette positioning device according to any one of the first aspect through the tenth aspect of the present invention.

Consequently, the present invention displays the superior effect of offering a marked improvement in reliability during the loading of a substrate, with no likelihood of damage being caused to the loading system.

In a method of transporting a substrate storage cassette according to a twelfth aspect of the present invention, the peripheral surface of a substrate storage cassette and an attached member provided on an installation platform are brought in contact, and the substrate storage cassette is then moved to a predetermined location.

Consequently, a superior effect of the present invention is that, in the case of a robot, the positioning of the wafer cassette into a predetermined location on the installation platform can be carried out simply and reliably even if the transfer precision of the robot is not particularly high, and even in the case where an operator performs the transfer, the operation can be completed quickly and simply.

What is claimed is:

1. A substrate storage cassette positioning device for positioning a substrate storage cassette in a predetermined location on an installation platform, comprising:
    a guide section disposed on said installation platform to guide said substrate storage cassette into said predetermined location during the positioning of said substrate storage cassette; and
    a positioning section disposed on said installation platform to position said substrate storage cassette in said predetermined location, a position of said positioning section on said installation platform being different from a position of said guide section on said installation platform.

2. A substrate storage cassette positioning device according to claim 1, wherein positioning concave portions are provided on a bottom surface of said substrate storage cassette, and said positioning section is provided on top of said installation platform, and comprises convex portions which will freely engage with said concave portions of said substrate storage cassette.

3. A substrate storage cassette positioning device according to claim 1, wherein
    said substrate storage cassette is positioned from above into said predetermined location on said installation platform,
    said installation platform comprises a retaining member that retains said substrate storage cassette in said predetermined location,
    said guide section comprises a sloped surface formed on said retaining member, and
    said substrate storage cassette is guided into said predetermined location by a peripheral section of a bottom surface of said substrate storage cassette contacting said sloped surface.

4. A substrate storage cassette positioning device according to claim 3, wherein
    a suction mechanism that suctions dust from said installation platform is provided near said retaining member.

5. A substrate storage cassette positioning device according to claim 1, wherein
    an impact absorption material is provided on either one of a peripheral section of a bottom surface of said substrate storage cassette and a guide section, to soften an impact when said substrate storage cassette contacts said guide section.

6. A substrate storage cassette positioning device according to claim 1, wherein said guide section has a first portion provided on said installation platform and a second portion provided on said substrate storage cassette.

7. A substrate storage cassette positioning device according to claim 6, wherein said first portion of said guide section is a sloped surface of an attached member which is attached to said installation platform.

8. A substrate storage cassette positioning device according to claim 7, wherein said second portion of said guide section is a sloped surface formed on said substrate storage cassette.

9. A substrate storage cassette positioning device according to claim 1, wherein
    positioning at said predetermined location is carried out through an engagement of a first engagement member which is provided on said substrate storage cassette, and a second engagement member which is provided on said installation platform and which engages with said first engagement member.

10. An exposure apparatus which uses light from an illumination system for transferring an image of a pattern of a mask through a projection optical system and onto a substrate, comprising:
    a positioning device for a substrate storage cassette according to claim 1 provided for positioning said substrate storage cassette, with said substrate stored therein, at a predetermined location on an installation platform.

11. A method of transporting a substrate storage cassette to a predetermined location on an installation platform, comprising:
    bringing into contact a peripheral surface of said substrate storage cassette and an attached member provided on said installation platform;

moving said substrate storage cassette near said predetermined location; and engaging a first engagement member provided on said substrate storage cassette and a second engagement member provided on said installation platform, a position of said second engagement member being different from a position of said attached member.

12. A method of transporting a substrate storage cassette according to claim 11, wherein the contacting of the peripheral surface of said substrate storage cassette with the attached member provided on said installation platform occurs via a guide section provided on at least one of said peripheral surface and said attached member, and said substrate storage cassette is moved to said predetermined location by said guide section.

13. A method of transporting a substrate storage cassette according to claim 12, wherein said guide section is a guide surface formed on at least one of said peripheral surface and said attached member.

14. A method of transporting a substrate storage cassette according to claim 12, wherein said substrate storage cassette is moved to a position above said installation platform, and said substrate storage cassette is then lowered towards said installation platform from said position above said installation platform, and partway through said descent, said peripheral section of said substrate storage cassette comes in contact with said attached member.

15. A method of transporting a substrate storage cassette according to claim 14, wherein said guide section provided on said attached member is a sloped surface which widens out in an upwards direction.

16. A method of transporting a substrate storage cassette according to claim 14, wherein said guide section provided on said peripheral surface of said substrate storage cassette is a sloped surface which converges in a direction of said descent.

* * * * *

UNITED STATES PATENT AND TRADEMARK OFFICE
CERTIFICATE OF CORRECTION

PATENT NO.    : 6,432,849 B1
DATED         : August 13, 2002
INVENTOR(S)   : Yutaka Endo and Nobuyoshi Tanno It is certified that error appears in the above-identified patent and that said Letters Patent is hereby corrected as shown below:

<u>Title page,</u>
Item [73], Assignee, change "Nikon Corporation, Tokyo (JP)" to
-- Nikon Corporation, Tokyo (JP) and Zao Nikon Co., Ltd.,
Katta-gun (JP) --.

Signed and Sealed this

Ninth Day of September, 2003

JAMES E. ROGAN
*Director of the United States Patent and Trademark Office*